United States Patent
Jin

(10) Patent No.: US 9,608,050 B2
(45) Date of Patent: Mar. 28, 2017

(54) ORGANIC LIGHT EMITTING DIODE DISPLAY UTILIZING A CURVED SEMICONDUCTOR LAYER

(71) Applicant: Samsung Display Co., Ltd., Yongin (KR)

(72) Inventor: Min-Hyun Jin, Yongin (KR)

(73) Assignee: Samsung Display Co., Ltd, Yongin-si (KR)

(*) Notice: Subject to any disclaimer, the term of this patent is extended or adjusted under 35 U.S.C. 154(b) by 0 days.

(21) Appl. No.: 14/800,247

(22) Filed: Jul. 15, 2015

(65) Prior Publication Data

US 2015/0318337 A1   Nov. 5, 2015

Related U.S. Application Data

(62) Division of application No. 14/199,411, filed on Mar. 6, 2014, now Pat. No. 9,117,783.

(30) Foreign Application Priority Data

May 30, 2013 (KR) .................. 10-2013-0062058

(51) Int. Cl.
H01L 27/32         (2006.01)

(52) U.S. Cl.
CPC ...... *H01L 27/3262* (2013.01); *H01L 27/3265* (2013.01); *H01L 27/3276* (2013.01)

(58) Field of Classification Search
CPC ............. H01L 51/0545; H01L 51/0036; H01L 27/1214; H01L 27/12; H01L 29/66757;

(Continued)

(56) References Cited

U.S. PATENT DOCUMENTS

| 7,646,044 B2* | 1/2010 | Huh et al. ............ 257/286 |
| 2005/0127357 A1* | 6/2005 | Wong ............ H01L 27/12 257/59 |

(Continued)

FOREIGN PATENT DOCUMENTS

| KR | 10-0642491 | 11/2006 |
| KR | 10-2010-0049385 | 5/2010 |
| KR | 10-2011-0042516 | 4/2011 |

OTHER PUBLICATIONS

Non-Final Office Action issued on Jan. 2, 2015, in U.S. Appl. No. 14/199,411.

(Continued)

*Primary Examiner* — John P Dulka
*Assistant Examiner* — Charles R Peters
(74) *Attorney, Agent, or Firm* — H.C. Park & Associates, PLC

(57) ABSTRACT

An organic light emitting diode (OLED) display including: a substrate; a semiconductor layer disposed on the substrate and including a switching semiconductor layer and a driving semiconductor layer connected to the switching semiconductor layer; a first gate insulating layer disposed on the semiconductor layer; a switching gate electrode and a driving gate electrode disposed on the first gate insulating layer and respectively overlapping with the switching semiconductor layer and the driving semiconductor layer; a second gate insulating layer disposed on the switching gate electrode and the driving gate electrode; a driving voltage line configured to transmit a driving voltage and disposed on the second gate insulating layer; an interlayer insulating layer disposed on the driving voltage line and the second gate insulating layer; and a data line configured to transmit a data signal and disposed on the interlayer insulating layer.

4 Claims, 5 Drawing Sheets

(58) Field of Classification Search
CPC ............. H01L 27/3262; H01L 27/3276; H01L 27/3265; B82Y 10/00
USPC ...................................... 257/40, 43, 59, 72
See application file for complete search history.

(56) References Cited

U.S. PATENT DOCUMENTS

| | | |
|---|---|---|
| 2011/0227896 A1 | 9/2011 | Hwang |
| 2013/0140538 A1* | 6/2013 | Fujita et al. .................... 257/40 |
| 2013/0207117 A1* | 8/2013 | An et al. ......................... 257/71 |

OTHER PUBLICATIONS

Notice of Allowance issued on Apr. 27, 2015, in U.S. Appl. No. 14/199,411.

* cited by examiner

ORGANIC LIGHT EMITTING DIODE DISPLAY UTILIZING A CURVED SEMICONDUCTOR LAYER

CROSS-REFERENCE TO RELATED APPLICATION

This application is a divisional of U.S. patent application Ser. No. 14/199,411, filed on Mar. 6, 2014, and claims priority to and the benefit of Korean Patent Application No. 10-2013-0062058, filed in the Korean Intellectual Property Office on May 30, 2013, the entire contents of both are incorporated herein by reference.

BACKGROUND OF THE INVENTION

Field

Exemplary embodiments of the present invention relate to an organic light emitting diode (OLED) display.

Discussion of the Background

An organic light emitting diode display includes two electrodes and an organic is emission layer interposed therebetween, wherein electrons injected from a cathode that is one electrode and holes injected from an anode that is the other electrode are bonded to each other in the organic emission layer to form excitons, and light is emitted while the excitons discharge energy.

The organic light emitting diode display includes a plurality of pixels including an organic light emitting diode that is formed of a cathode, an anode, and an organic emission layer, and a plurality of transistors and storage capacitors for driving the organic light emitting diode are formed in each pixel. The plurality of transistors includes a switching transistor and a driving transistor.

When light emitted from the organic light emitting diode is displayed, the light has a range from a black color to a white color according to a driving current Id flowing through the organic light emitting diode, an interval between a gate voltage displaying the black color and a gate voltage displaying the white color is defined as a driving range of the gate voltage. The higher the resolution of the organic light emitting diode display is, the smaller the size of each pixel is, and thus an amount of flowing current per pixel is reduced such that a driving range of a gate voltage applied to a gate electrode of the switching transistor and the driving transistor becomes narrow. Accordingly, it is difficult to adjust the magnitude of the gate voltage Vgs applied to the driving transistor so as to ensure a large grayscale range.

Also, as the organic light emitting diode (OLED) display becomes high resolution, the size of each pixel is decreased such that an interval between the driving voltage line and the data line that are formed with the same layer is decreased, and then a short between the driving voltage line and the data line may be easily generated, and the shorter distances are vulnerable to particles.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

Exemplary embodiments of the present invention relates to an organic light emitting diode (OLED) display realizing high resolution by forming a driving voltage line and a data line with different layers.

Additional features of the invention will be set forth in the description which follows, and in part will be apparent from the description, or may be learned by practice of the invention.

Exemplary embodiments of the present invention provide an organic light emitting diode (OLED) display including: a substrate; a semiconductor layer disposed on the substrate and including a switching semiconductor layer and a driving semiconductor layer connected to the switching semiconductor layer; a first gate insulating layer disposed on the semiconductor layer; a switching gate electrode and a driving gate electrode disposed on the first gate insulating layer and respectively overlapping with the switching semiconductor layer and the driving semiconductor layer; a second gate insulating layer disposed on the switching gate electrode and the driving gate electrode; a driving voltage line configured to transmit a driving voltage and disposed on the second gate insulating layer; an interlayer insulating layer disposed on the driving voltage line and the second gate insulating layer; and a data line configured to transmit a data signal and disposed on the interlayer insulating layer.

Exemplary embodiments of the present invention provide an OLED display including: a semiconductor layer disposed on the substrate and comprising a switching semiconductor layer and a driving semiconductor layer connected to the switching semiconductor layer; a gate insulating layer disposed on the semiconductor layer; a driving voltage line configured to transmit a driving voltage; a data line configured to transmit a data signal; and an interlayer insulating layer to space-apart the driving voltage line and the data line, wherein the gate insulating layer supports the driving voltage line, the data line and the interlayer insulating layer.

According to exemplary embodiments of the present invention, by forming the driving voltage line and the data line, a short between the driving voltage line and the data line may be prevented thereby realizing high resolution.

According to exemplary embodiments, by forming the driving semiconductor layer with the curved shape, a long driving semiconductor layer may be formed in a narrow space such that the driving range of the gate voltage applied to the driving gate electrode may be increased. Therefore, a grayscale of light emitted from an organic light emitting diode (OLED) can be more finely controlled by changing the magnitude of the gate voltage, and as a result, it is possible to increase the resolution of the organic light emitting diode display and improve display quality.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
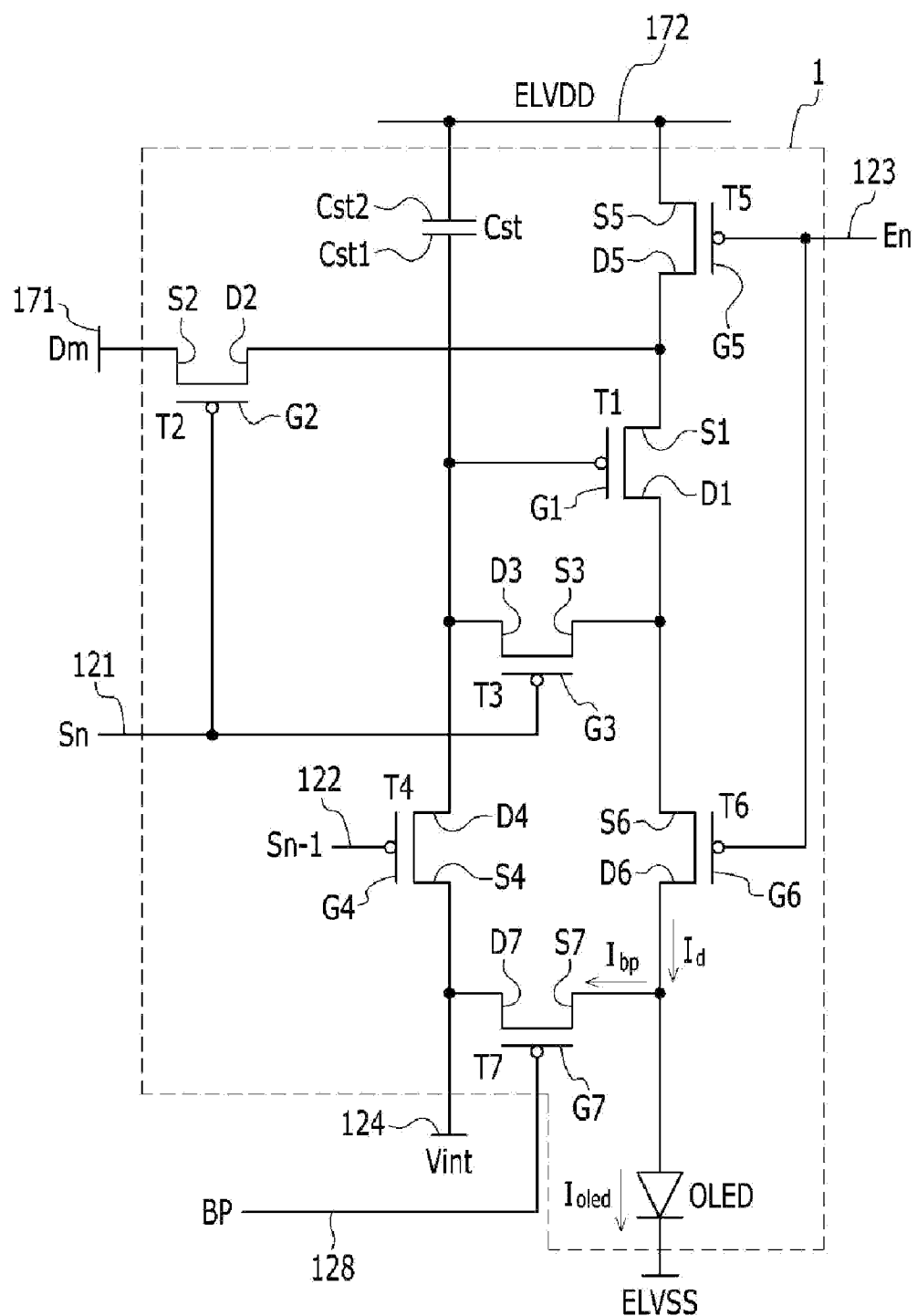
FIG. 1 is an exemplary circuit of one pixel of an organic light emitting diode (OLED) display according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

In addition, the size and thickness of each configuration shown in the drawings are arbitrarily shown for better understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present, but does not essentially mean positioning on the upper side of the object portion based on a gravity direction.

Further, in the specification, the phrase "on a flat surface" means when an object portion is viewed from above, and the phrase "on a cross-section" means when a cross-section taken by vertically cutting an object portion is viewed from the side.

An organic light emitting diode (OLED) display according to exemplary embodiments of the present invention will be described with reference to FIG. 1, FIG. 2, FIG. 3, FIG. 4 and FIG. 5.

FIG. 1 is an exemplary circuit of one pixel of an organic light emitting diode (OLED) display according to exemplary embodiments of the present invention.

As shown in FIG. 1, one pixel 1 of an organic light emitting diode (OLED) display according to exemplary embodiments of the present invention includes a plurality of signal lines 121, 122, 123, 124, 128, 171, and 172, a plurality of transistors T1, T2, T3, T4, T5, T6, and T7 connected to the plurality of signal lines, a storage capacitor (Cst), and an organic light emitting diode (OLED).

The transistors include a driving transistor T1, a switching transistor T2, a compensation transistor T3, an initialization transistor T4, an operation control transistor T5, a light emission control transistor T6, and a bypass transistor T7.

The signal lines include a scan line 121 transmitting a scan signal Sn, a previous scan line 122 transmitting a previous scan signal Sn−1 to the initialization transistor T4, a light emission control line 123 transmitting a light emission control signal En to the operation control transistor T5 and the light emission control transistor T6, an initialization voltage line 124 initializing an initialization voltage Vint to the driving transistor T1, a bypass control line 128 transmitting a bypass signal BP to the bypass thin film transistor T7, a data line 171 crossing the scan line 121 and transmitting a data signal Dm, and a driving voltage line 172 transmitting a driving voltage ELVDD and parallel to a data line 171.

A gate electrode G1 of the driving transistor T1 is connected to an end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives a data signal Dm according to a switching operation of the pixel switching transistor T2 to supply a driving current Id to the organic light emitting diode (OLED).

A gate electrode G2 of the switching transistor T2 is connected to the scan line 121, a source electrode S2 of the switching transistor T2 is connected to the data line 171, and a drain electrode D2 of the switching transistor T2 is connected via the operation control transistor T5 to the driving voltage line 172 while being connected to the source electrode S1 of the driving transistor T1. The switching transistor T2 is turned on according to the scan signal Sn transferred through the scan line 121 to perform a switching operation of transferring the data signal Dm transferred to the data line 171 to the source electrode of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to an end Cst1 of the storage capacitor Cst, a drain electrode D4 of the initialization transistor T4, and the gate electrode G1 of the driving transistor T1. The compensation transistor T3 is turned on according to the scan signal Sn transferred through the scan line 121 to connect the gate electrode G1 and the drain electrode D1 of the driving transistor T1 to each other, thus performing diode-connection of the driving transistor T1.

A gate electrode G4 of the initialization transistor T4 is connected to the prior scan line 122, a source electrode S4 of the initialization transistor T4 is connected to the initialization voltage line 124, and a drain electrode D4 of the initialization transistor T4 is connected to an end Cst1 of the storage capacitor Cst, the drain electrode D3 of the compensation transistor T3, and the gate electrode G1 of the driving transistor. The initialization transistor T4 is turned on according to the prior scan signal Sn−1 transferred through the prior scan line 122 to transfer the initialization voltage Vint to the gate electrode G1 of the driving transistor T1, thus performing an initialization operation for initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned on according to the light emission control signal En transferred through the light emission control line 123 to transfer the driving voltage ELVDD to the organic light emitting diode (OLED), thus allowing the driving current Id to flow in the organic light emitting diode (OLED).

The bypass thin film transistor T7 includes a gate electrode G7 connected to the bypass control line 128, a source electrode S7 connected to the drain electrode D6 of the light emission control thin film transistor T6 and the anode of the organic light emitting diode (OLED), and a drain electrode D7 connected to the initialization voltage line 124 and the source electrode S4 of the initialization thin film transistor T4.

The other end Cst2 of the storage capacitor Cst is connected to the driving voltage line 172, and a cathode of the organic light emitting diode (OLED) is connected to a common voltage ELVSS. Accordingly, the organic light emitting diode (OLED) receives the driving current Id from the driving transistor T1 to emit light, thereby displaying an image.

Hereinafter, an operation process of one pixel of the organic light emitting diode display according to the exemplary embodiments of the present invention will be described in detail.

First, the prior scan signal Sn−1 of a low level is supplied through the prior scan line 122 during an initialization period. Then, the initialization transistor T4 is turned on corresponding to the prior scan signal Sn−1 of the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn of the low level is supplied through the scan line 121 during a data programming period. Then, the switching transistor T2 and the compensation transistor T3 are turned on corresponding to the scan signal Sn of the low level.

In this case, the driving transistor T1 is diode-connected by the turned-on compensation transistor T3, and biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned on by the light emission control signal En of the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). A gate-source voltage Vgs of the driving transistor T1 is maintained at (Dm+Vth)-ELVDD by the storage capacitor Cst during the light emission period, and the driving current Id is proportional to a square of a value obtained by subtracting the threshold voltage from a source-gate voltage, that is, (Dm-ELVDD)2, according to a current-voltage relationship of the driving transistor T1. Accordingly, the driving current Id is determined regardless of the threshold voltage Vth of the driving transistor T1.

At this time, the bypass transistor T7 receives the bypass signal BP from the bypass control line 128. The bypass signal BP is a voltage of a predetermined level capable of turning off the bypass transistor T7, and the bypass transistor T7 transmits the voltage of the transistor off level to the gate electrode G7 such that the bypass transistor T7 is always turned off and the portion of the driving current Id is discharged as the bypass current Ibp through the bypass transistor T7 in the off state.

The correct black luminance image is realized by using the bypass transistor to improve the contrast ratio. When a minimum current of the driving transistor displaying a black image flows as the driving current, if the organic light emitting diode (OLED) emits light, the black image is not normally displayed. Accordingly, the bypass transistor T7 of the organic light emitting diode (OLED) display according to exemplary embodiments of the present invention may disperse a portion of the minimum current of the driving transistor T1 as the bypass current Ibp to another current path besides the current path at the side of the organic light emitting diode (OLED). The minimum current of the driving transistor includes a current in a condition that the gate-source voltage Vgs of the driving transistor is smaller than the threshold voltage Vth such that the driving transistor is turned off. In the condition of turning off the driving transistor, the minimum driving current (e.g., a current of less than 10 pA) is transmitted to the organic light emitting diode (OLED) thereby displaying the image of the black luminance. When the minimum driving current displaying the black image flows, an influence of the distortion transmission of the bypass current Ibp is large. The influence of the bypass current Ibp is small when the driving current displaying an image, such as, a general image or a white image, flows. Accordingly, when the driving current flowing is for displaying a black image, the light emitting current Ioled of the organic light emitting diode (OLED) of which the current amount of the bypass current Ibp that is discharged through the bypass transistor T7 from the driving current Id is decreased has a minimum current amount of a degree capable of surely displaying the black image. Accordingly, the correct black luminance image is realized by using the bypass transistor thereby improving the contrast ratio.

Next, a detailed structure of the pixel of the organic light emitting diode (OLED) display shown in FIG. 1 will be described in detail with reference to FIG. 2, FIG. 3, FIG. 4 and FIG. 5 as well as FIG. 1.

Figure 2:
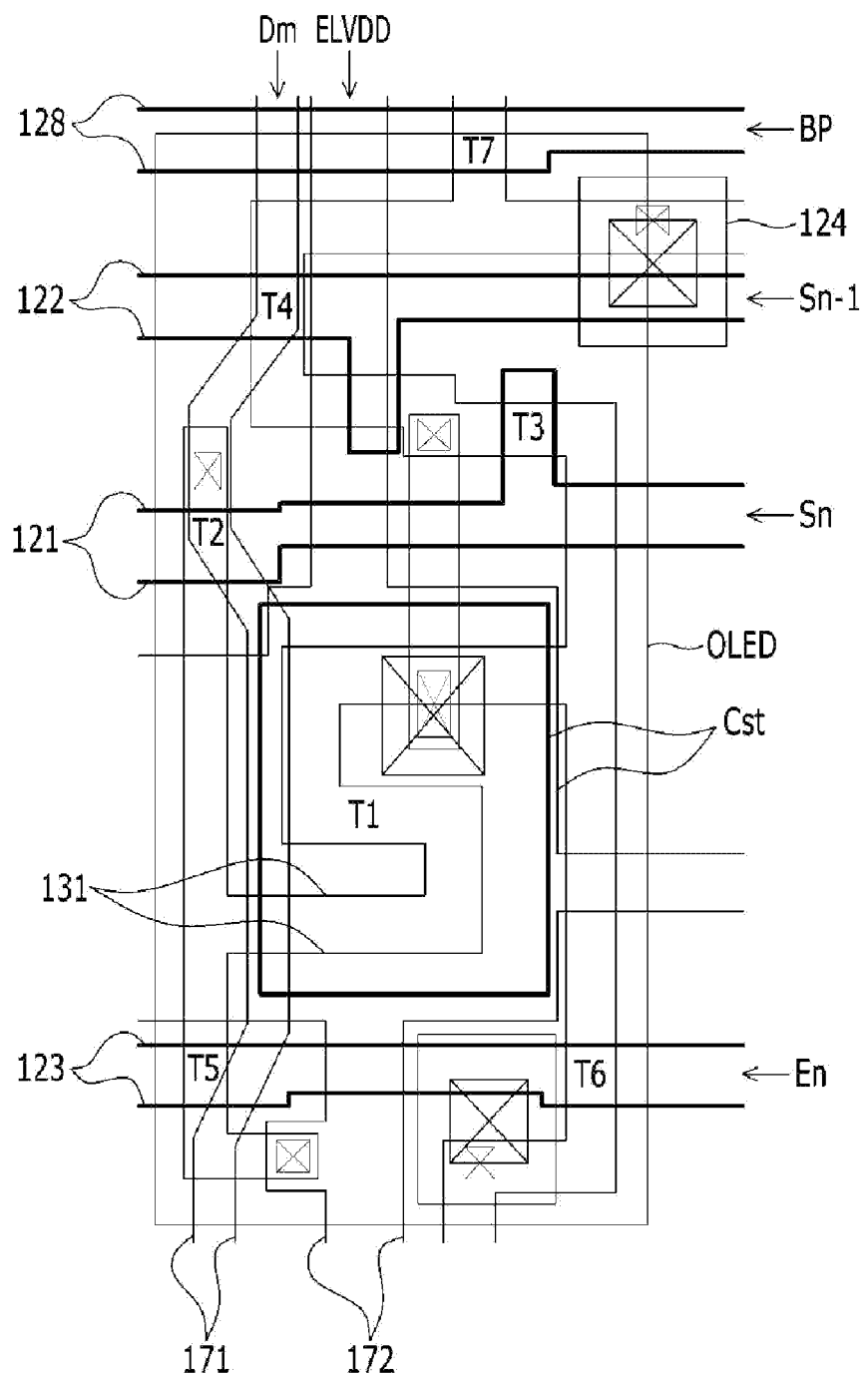
FIG. 2 is a schematic view of a plurality of transistors and capacitors of an organic light emitting diode (OLED) display according to exemplary embodiments of the present invention.
Figure 3:
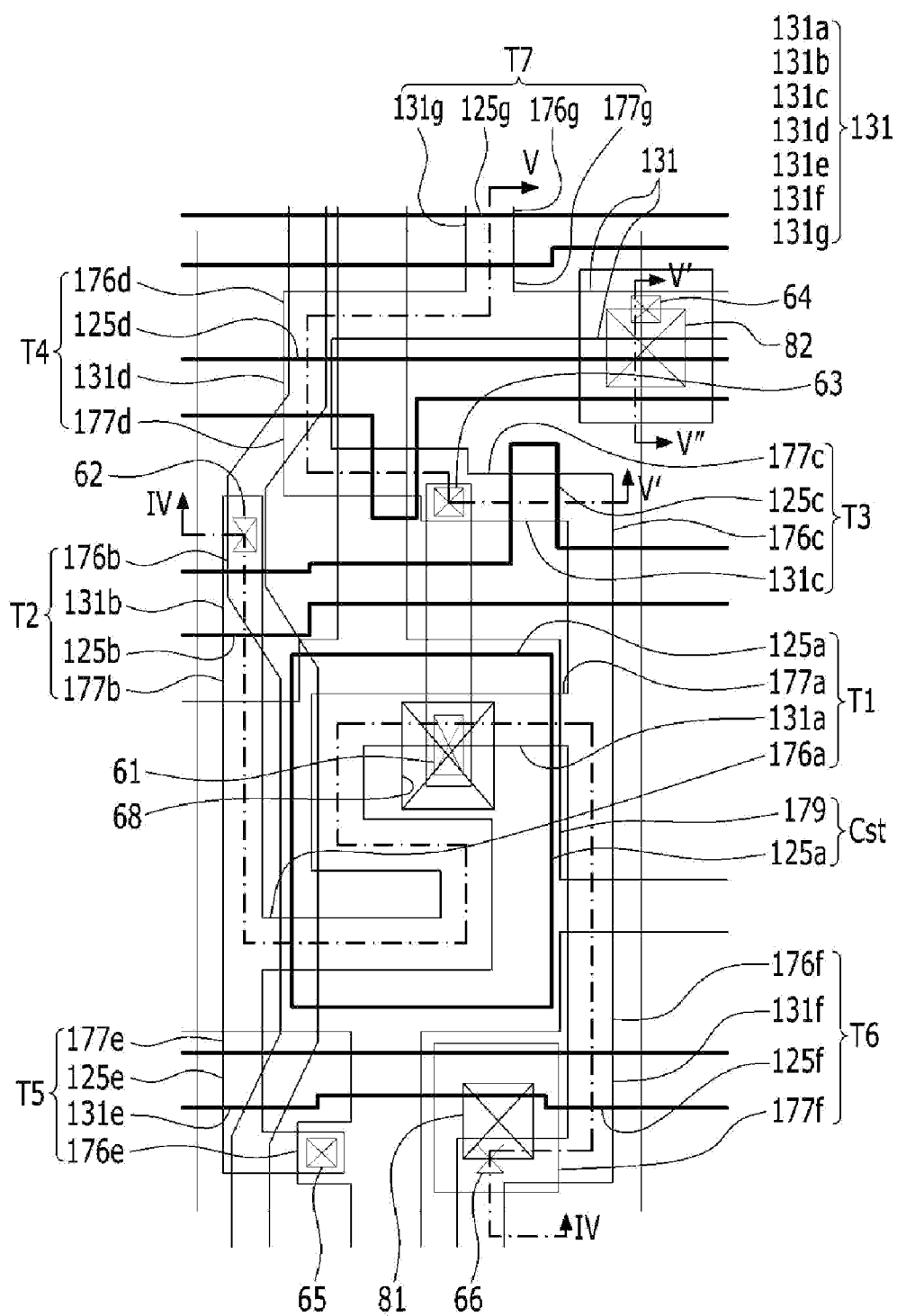
FIG. 3 is a detailed layout view of FIG. 2.
Figure 4:
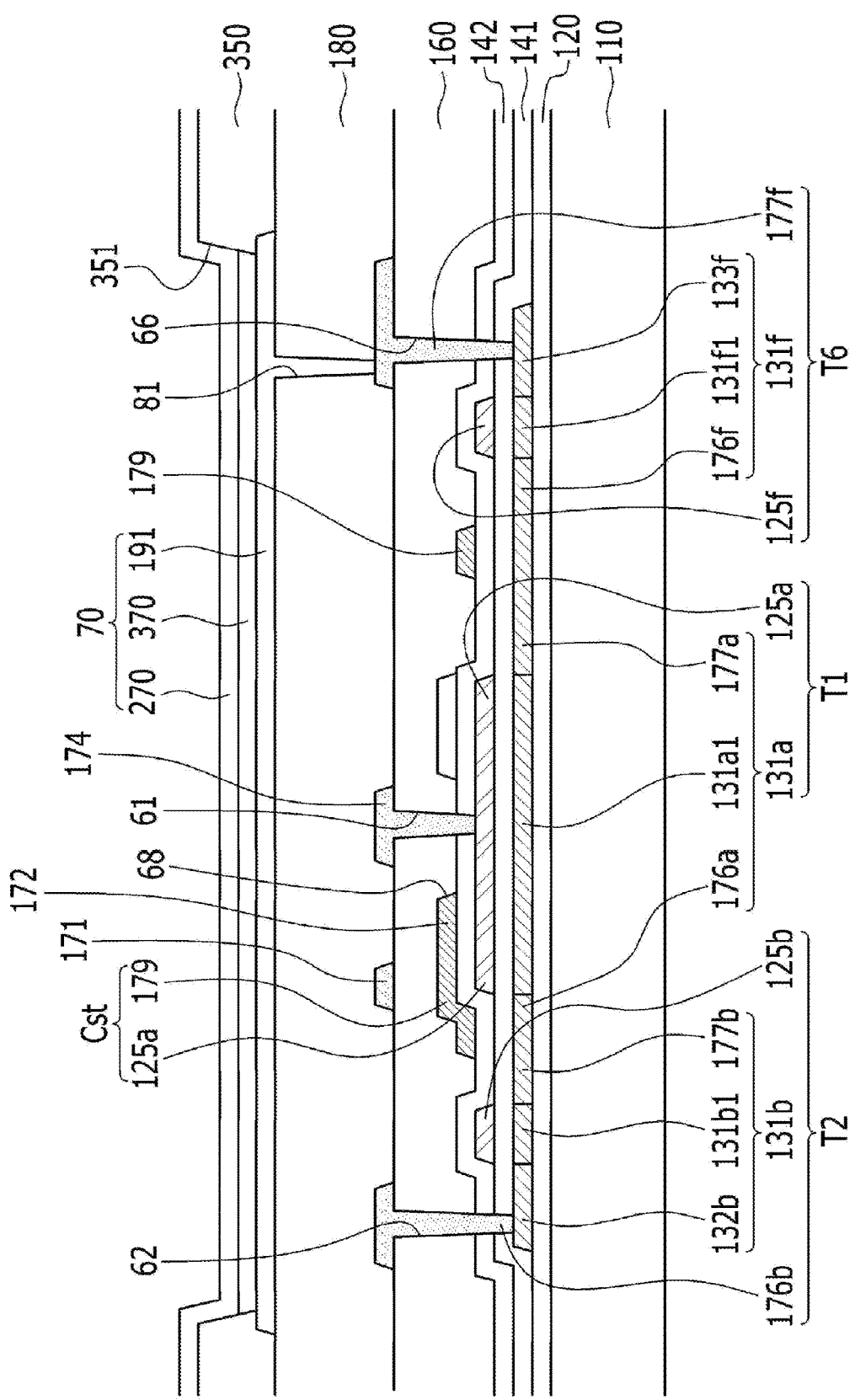
FIG. 4 is a cross-sectional view of the organic light emitting diode (OLED) display of FIG. 3 taken along the line IV-IV.
Figure 5:
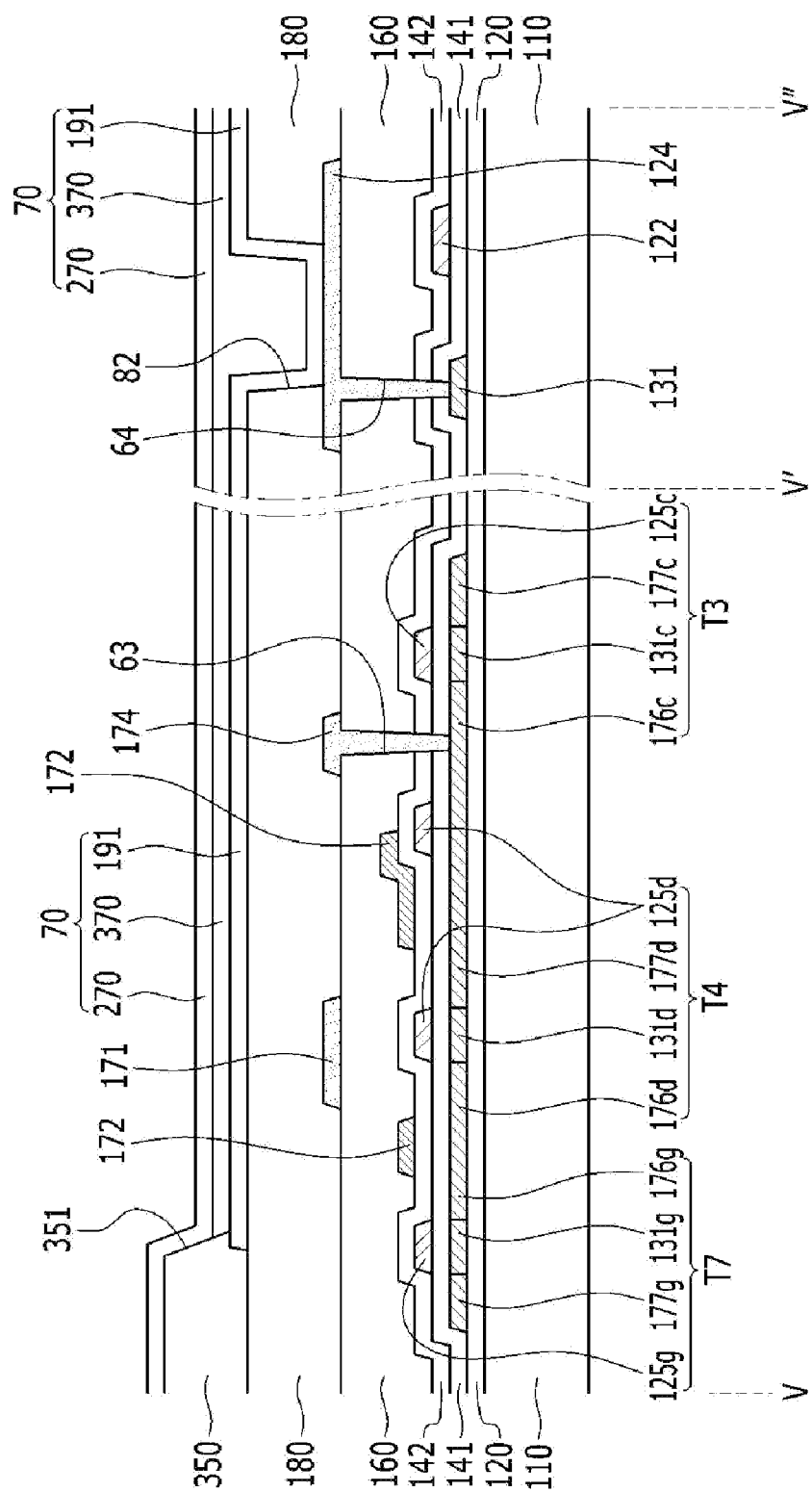
FIG. 5 is a cross-sectional view of the organic light emitting diode (OLED) display of FIG. 3 taken along the lines V-V' and V'-V".

FIG. 2 is a schematic view of a plurality of transistors and capacitors of an organic light emitting diode (OLED) display according to exemplary embodiments of the present invention, FIG. 3 is a detailed layout view of FIG. 2, FIG. 4 is a cross-sectional view of the organic light emitting diode (OLED) display of FIG. 3 taken along the line IV-IV, and FIG. 5 a cross-sectional view of the organic light emitting diode (OLED) display of FIG. 3 taken along the lines V-V' and V'-V".

As shown in FIG. 2, an organic light emitting diode (OLED) display according to exemplary embodiments of the present invention includes a scan line 121, a previous scan line 122, a light emission control line 123, and a bypass control line 128 respectively applying a scan signal Sn, a previous scan signal Sn−1, a light emission control signal En, and a bypass signal BP and formed according to a row direction, and includes a data line 171 and a driving voltage line 172 intersecting the scan line 121, the previous scan line 122, the light emission control line 123, and the bypass control line 128 and applying a data signal Dm and a driving voltage ELVDD to a pixel. An initialization voltage Vint (see FIG. 1) is transmitted from the organic light emitting diode (OLED) to the compensation transistor T3 through the initialization voltage line 124.

The pixel also includes a driving transistor T1, a switching transistor T2, a compensation transistor T3, an initialization transistor T4, an operation control transistor T5, a light emission control transistor T6, a bypass transistor T7, a storage capacitor Cst, and an organic light emitting diode (OLED).

The driving transistor T1, the switching transistor T2, the compensation transistor T3, the initialization transistor T4, the operation control transistor T5, the light emission control transistor T6, and the bypass transistor T7 are formed according to a semiconductor layer 131, and the semiconductor layer 131 is bent with various shapes. The semiconductor layer 131 may be formed of polysilicon or an oxide semiconductor. The oxide semiconductor may include any one of oxides including titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as, zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate protective layer may be added to protect the oxide semiconductor, as the semiconductor layer 131 may be weak with regard to an external environment, such as, high temperatures.

The semiconductor layer 131 includes a channel region that is subjected to channel doping with an N-type impurity or a P-type impurity, and a source region and a drain region that are formed at respective sides of the channel region and formed by doping a doping impurity having a type that is opposite of the doping impurity doped in the channel region.

Hereinafter, a flat surface type of structure of the organic light emitting diode display according to the exemplary embodiments of the present invention will be first described in detail with reference to FIG. 2 and FIG. 3, and a lamination structure thereof will be described in detail with reference to FIG. 4 and FIG. 5.

Firstly, as shown in FIG. 2 and FIG. 3, the pixel 1 of the organic light emitting diode (OLED) display according to exemplary embodiments of the present invention includes the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode (OLED), Transistors T1, T2, T3, T4, T5, T6, and T7 are formed according to the semiconductor layer 131. The semiconductor layer 131 includes a driving semiconductor layer 131a formed at the driving transistor T1, a switching semiconductor layer 131b formed at the switching transistor T2, a compensation semiconductor layer 131c formed at the compensation transistor T3, an initialization semiconductor layer 131d formed at the initialization transistor T4, an operation control semiconductor layer 131e formed at the operation control transistor T5, a light emission control semiconductor layer 131f formed at the light emission control transistor T6, and a bypass semiconductor layer 131g formed at the bypass thin film transistor T7.

The driving transistor T1 includes the driving semiconductor layer 131a, a driving gate electrode 125a, a driving source electrode 176a, and a driving drain electrode 177a.

The driving semiconductor layer 131a is bent, it may have a zigzag shape, and may be disposed with a "5" shape. As described above, by forming the driving semiconductor layer 131a of the curved shape, a long driving semiconductor layer 131a may be formed in a narrow space. Accordingly, a long driving channel region 131a1 (FIG. 4) of the driving semiconductor layer 131a may be formed such that a driving range of the gate voltage applied to the driving gate electrode 125a is broadened. Therefore, since the driving range of the gate voltage is broad, a grayscale of light emitted from an organic light emitting diode (OLED) can be more finely controlled by changing the magnitude of the gate voltage, and as a result, it is possible to increase the resolution of the organic light emitting diode display and improve display quality. By varying the shape of the driving semiconductor layer 131a, various exemplary embodiments of "ㄷ", "S", "M", and "W" shapes are possible.

The driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a. The driving gate electrode 125a overlaps the driving semiconductor layer 131a, and the driving gate electrode 125a is formed with the same layer as the scan line 121, the prior scan line 122, the light emission control line 123, a switching gate electrode 125b, a compensation gate electrode 125c, an initialization gate electrode 125d, an operation control gate electrode 125e, and a light emission control gate electrode 125f.

The switching transistor T2 includes the switching semiconductor layer 131b, the switching gate electrode 125b, a switching source electrode 176b, and a switching drain electrode 177b. The switching source electrode 176b as a portion of the data line 171 is connected to the switching semiconductor layer 131b through a contact hole 62 and is simultaneously connected to the data line 171, and the switching drain electrode 177b corresponds to the switching drain region 177b doped with the impurity in the switching semiconductor layer 131b.

The compensation transistor T3 includes the compensation semiconductor layer 131c, the compensation gate electrode 125c, a compensation source electrode 176c, and a compensation drain electrode 177c, the compensation source electrode 176c corresponds to the compensation source region 176c doped with the impurity in the compensation semiconductor layer 131c, and the compensation drain electrode 177c corresponds to the compensation drain region 177c doped with the impurity.

The initialization transistor T4 includes the initialization semiconductor layer 131d, the initialization gate electrode 125d, an initialization source electrode 176d, and an initialization drain electrode 177d. The initialization source electrode 176d corresponds to the initialization source region 176d doped with the impurity and the initialization drain electrode 177d corresponds to the initialization drain region 177d doped with the impurity.

The operation control transistor T5 includes the operation control semiconductor layer 131e, the operation control gate electrode 125e, an operation control source electrode 176e, and an operation control drain electrode 177e. The operation control source electrode 176e as a portion of the driving voltage line 172 is connected to the operation control semiconductor layer 131e through a contact hole 65, and the operation control drain electrode 177e corresponds to the operation control drain region 177e doped with the impurity in the operation control semiconductor layer 131e.

The light emission control transistor T6 includes the light emission control semiconductor layer 131f, the light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f, and the light emission control drain electrode 177f is connected to the light emission control semiconductor layer 131f through a contact hole 66.

The bypass thin film transistor T7 includes the bypass semiconductor layer 131g, a bypass gate electrode 125g, a bypass source electrode 176g, and a bypass drain electrode 177g. The bypass source electrode 176g corresponds to the bypass source region 176g doped with the impurity in the bypass semiconductor layer 131g, and the bypass drain electrode 177g corresponds to the bypass drain region 177g doped with the impurity in the bypass semiconductor layer 131g. The bypass source electrode 176g is directly connected to the light emission control drain region 133f.

An end of the driving semiconductor layer 131a of the driving transistor T1 is connected to the switching semiconductor layer 131b and the compensation semiconductor layer 131c, and the other end of the driving semiconductor layer 131a is connected to the operation control semiconductor layer 131e and the light emission control semiconductor layer 131f.

Therefore, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage electrode 125a and a second storage electrode 179 disposed via a second gate insulating layer 142 interposed therebetween. The first storage capacitive plate 125a is the driving gate electrode 125a, and the second storage capacitive plate (second storage electrode) 179 is an enlarged portion of the driving voltage line 172. Here, the second gate insulating layer 142 becomes a dielectric material, and the storage capacitance is determined by charges charged in the storage capacitor Cst and the voltage between two charging plates 125a and 179.

The first storage capacitive plate 125a as the driving gate electrode 125a passes through a capacitive opening 68 formed at the second storage capacitive plate 179, and is connected to a connection member 174 through a contact hole 61 formed in the second gate insulating layer 142 and an interlayer insulating layer 160. The connection member 174 is parallel to and is formed with the same layer as the data line 171, and connects the driving gate electrode 125a and the compensation semiconductor layer 131c of the compensation thin film transistor T3.

The connection member 174 is connected to the compensation semiconductor layer 131c of the compensation thin film transistor T3 through a contact hole 63 formed in the first gate insulating layer 141, the second gate insulating layer 142 and an interlayer insulating layer 160.

Accordingly, the storage capacitor Cst stores a storage capacitance corresponding to a difference between the driving voltage ELVDD transmitted to the second storage capacitive plate 179 through the driving voltage line 172 and the gate voltage of the driving gate electrode 125a.

The switching transistor T2 is used as a switching element for selecting a pixel that is to emit light. The switching gate electrode 125b is connected to the scan line 121, the switching source electrode 176b is connected to the data line 171, and the switching drain electrode 177b is connected to the driving transistor T1 and the operation control transistor T5. The light emission control drain electrode 177f of the light emission control transistor T6 is directly connected to a pixel electrode 191 of the organic light emitting diode 70.

Hereinafter, referring to FIG. 4 and FIG. 5, a structure of the organic light emitting diode display according to the exemplary embodiments of the present invention will be described in detail according to the lamination order.

The structure of the transistor will be described based on the driving transistor T1, the switching transistor T2, and the light emission control transistor T6. The compensation transistor T3, the initialization transistor T4, and the bypass transistor T7 are the same as the deposition structure of the switching transistor T2, and the operation control transistor T5 is the same as the deposition structure of the light emission control transistor T6, so the detailed description thereof is omitted.

A buffer layer 120 is formed on a substrate 110, and the substrate 110 is formed of an insulating substrate made of glass, quartz, ceramics, plastics, or the like.

A driving semiconductor layer 131a, a switching semiconductor layer 131b, and a light emission control semiconductor layer 131f are formed on the buffer layer 120.

The driving semiconductor layer 131a includes a driving channel region 131a1, and the driving source region 176a and the driving drain region 177a facing each other with the driving channel region 131a1 interposed therebetween, the switching semiconductor layer 131b includes a switching channel region 131b1, and a switching source region 132b and a switching drain region 177b facing each other with the switching channel region 131b1 interposed therebetween, and the light emission control transistor T6 includes a light emission control channel region 131f1, the light emission control source region 176f, and a light emission control drain region 133f.

A first gate insulating layer 141 is formed on the switching semiconductor layer 131a, the driving semiconductor layer 131b, and the light emission control semiconductor layer 131f. On the first gate insulating layer 141, gate wires 121 (see FIG. 1), 122, 123 (see FIG. 1), 125a, 125b, and 125f including the scan line 121 including the switching gate electrode 125b, the previous scan line 122, the light emission control line 123 including the light emission control gate electrode 125f, and the driving gate electrode (the first storage capacitive plate) 125a are formed.

The second gate insulating layer 142 is formed on the gate wires 121, 122, 123, 125b, and 125f and the first gate insulating layer 141. The first gate insulating layer 141 and the second gate insulating layer 142 are formed of silicon nitride (SiNx) or silicon oxide (SiO2).

A driving voltage line 172 including the second storage capacitive plate 179 (FIG. 4) is formed on the second gate insulating layer 142. An interlayer insulating layer 160 is formed on the second gate insulating layer 142 and the driving voltage line 172. The interlayer insulating layer 160 may be made of a ceramic-based material such as silicon nitride (SiNx) or silicon oxide (SiO2).

On the interlayer insulating layer 160, data wires 171, 176b, 177f, and 124 including a data line 171 including a switching source electrode 176b, a light emission control drain electrode 177f, and an initialization voltage line 124 are formed.

As described above, by forming the driving voltage line 172 and the data line 171 with the different layers, a short between the driving voltage line 172 and the data line 171 may be prevented thereby realizing high resolution.

The switching source electrode 176b is connected to the switching semiconductor layer 131b through the contact hole 62 formed in the interlayer insulating layer 160, the first gate insulating layer 141, and the second gate insulating layer 142, the light emission control drain electrode 177f is connected to the light emission control semiconductor layer 131f through the contact hole 66 formed in the first gate insulating layer 141, the second gate insulating layer 142, and the interlayer insulating layer 160, and the initialization voltage line 124 is connected to the semiconductor layer 131 through a contact hole 64 (see also FIG. 3) formed in the first gate insulating layer 141, the second gate insulating layer 142, and the interlayer insulating layer 160.

A protective layer 180 covering the data wires 171, 176b, 177f, and 124 is formed on the interlayer insulating layer 160, and the pixel electrode 191 is formed on the protective layer 180. The pixel electrode 191 is connected to the light emission control drain electrode 177f through a contact hole 81 (see also FIG. 3) formed in the protective layer 180, and the initialization voltage line 124 is connected to the pixel electrode 191 through a contact hole 82 (see also FIG. 3) formed in the protective layer 180.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of a resin such as a polyacrylate and a polyimide, or of silica-based inorganic materials.

An organic emission layer 370 is formed on the pixel electrode 191 exposed through the barrier rib opening 351, and a common electrode 270 is formed on the organic emission layer 370. The organic light emitting diode 70 including the pixel electrode 191, the organic emission layer 370, and the common electrode 270 is formed as described above.

Herein, the pixel electrode 191 is an anode that is a hole injection electrode, and the common electrode 270 is a cathode that is an electron injection electrode. However, the exemplary embodiments according to the present invention are not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic emission layer 370, and when an exciton that is a combination of an injected hole and an injected electron falls from an exited state to a ground state, light is emitted.

The organic emission layer 370 is formed of a low molecular weight organic material or a high molecular weight organic material such as PEDOT (poly(3,4-ethylene-dioxythiophene)). Further, the organic emission layer 370 may be formed of a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 191 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to implement a color image.

Further, the organic emission layer 370 may implement the color image by laminating all of the red organic emission layer, the green organic emission layer, and the blue organic emission layer in the red pixel, the green pixel, and the blue pixel together, and forming a red color filter, a green color filter, and a blue color filter for each pixel. As another example, a white organic emission layer emitting light having a white color may be formed in all of the red pixel, the green pixel, and the blue pixel, and the red color filter, the green color filter, and the blue color filter may be formed for each pixel to implement the color image. In the case where the color image is implemented by using the white organic emission layer and the color filter, deposition masks for depositing the red organic emission layer, the green organic emission layer, and the blue organic emission layer on each pixel, that is, the red pixel, the green pixel, and the blue pixel, may not be used.

A white organic emission layer described in another example may be formed of one organic emission layer, and includes a constitution in which a plurality of organic emission layers are laminated to emit light having the white color. For example, a constitution in which at least one yellow organic emission layer and at least one blue organic emission layer are combined to emit light having the white color, a constitution in which at least one cyan organic emission layer and at least one red organic emission layer are combined to emit light having the white color, a constitution in which at least one magenta organic emission layer and at least one green organic emission layer are combined to emit light having the white color, or the like, may be included.

A sealing member (not illustrated) for protecting the organic light emitting diode 70 may be formed on the common electrode 270, may be sealed by a sealant on the substrate 110, and may be formed of various materials, such as, glass, quartz, ceramic, plastics, and metal. Meanwhile, a sealing thin film layer may be formed by depositing an inorganic layer and an organic layer on the common electrode 270 while not using the sealant.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A pixel circuit of a display device, the pixel circuit comprising:
    a semiconductor layer comprising a driving semiconductor layer, a switching semiconductor layer, a compensation semiconductor layer, an operation control semiconductor layer, and a light emission control semiconductor layer in a single continuous layer such that a first end of the driving semiconductor layer is connected to the switching semiconductor layer and the operation control semiconductor layer, and a second end of the driving semiconductor layer is connected to the compensation semiconductor layer and the light emission control semiconductor layer;
    a gate insulating layer disposed on the semiconductor layer;
    a driving voltage line configured to transmit a driving voltage;
    a data line configured to transmit a data signal; and
    an interlayer insulating layer disposed between the driving voltage line and the data line.

2. The circuit of claim 1, wherein the interlayer insulating layer is disposed directly on the driving voltage line, and the data line is disposed directly on the interlayer insulating layer.

3. The circuit of claim 1, wherein the driving semiconductor layer has a zigzag shape in a plan view.

4. A pixel circuit of a display device, the pixel circuit comprising:
    a semiconductor layer comprising a driving semiconductor layer, a switching semiconductor layer, a compensation semiconductor layer, an operation control semiconductor layer, and a light emission control semiconductor layer such that the driving semiconductor layer is connected to each of the switching semiconductor layer, the compensation semiconductor layer, the operation control semiconductor layer, and the light emission control semiconductor layer via the semiconductor layer;
    a gate insulating layer disposed on the semiconductor layer;
    a driving voltage line configured to transmit a driving voltage;
    a data line configured to transmit a data signal; and
    an interlayer insulating layer disposed between the driving voltage line and the data line,
    wherein:
    the driving semiconductor layer has a curved shape in a plan view; and
    the semiconductor layer further comprises an initialization semiconductor layer and a bypass semiconductor layer, the initialization semiconductor layer connecting the bypass semiconductor layer with the compensation semiconductor layer.

* * * * *